(12) United States Patent
Liu et al.

(10) Patent No.: US 10,156,478 B2
(45) Date of Patent: Dec. 18, 2018

(54) SYSTEM AND METHOD OF MONITORING AND CONTROLLING TEMPERATURE OF SEMICONDUCTOR SUBSTRATES IN FOUP

(71) Applicant: TAIWAN SEMICONDUCTOR MANUFACTURING CO., LTD., Hsinchu (TW)

(72) Inventors: Chun-Chang Liu, New Taipei (TW); Tzy-Kuang Lee, Taichung (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 480 days.

(21) Appl. No.: 14/850,878

(22) Filed: Sep. 10, 2015

(65) Prior Publication Data

US 2017/0074727 A1    Mar. 16, 2017

(51) Int. Cl.
*G01J 5/00* (2006.01)
*G01J 5/02* (2006.01)
*H01L 21/673* (2006.01)
*H01L 21/677* (2006.01)
*H01L 21/67* (2006.01)

(52) U.S. Cl.
CPC ............. *G01J 5/0007* (2013.01); *G01J 5/025* (2013.01); *G01J 5/026* (2013.01); *H01L 21/67248* (2013.01); *H01L 21/67393* (2013.01); *G01J 2005/0077* (2013.01); *H01L 21/67769* (2013.01)

(58) Field of Classification Search
None
See application file for complete search history.

(56) References Cited

U.S. PATENT DOCUMENTS

| | | | | |
|---|---|---|---|---|
| 6,922,867 B1* | 8/2005 | Hao | ............................. | B08B 5/02 15/312.1 |
| 2002/0070095 A1* | 6/2002 | Osaka | ................... | H01L 21/681 198/394 |
| 2012/0083918 A1* | 4/2012 | Yamazaki | ......... | H01L 21/67389 700/112 |
| 2014/0200702 A1* | 7/2014 | Liu | ....................... | G01N 29/14 700/112 |

* cited by examiner

*Primary Examiner* — John Kuan
(74) *Attorney, Agent, or Firm* — Maschoff Brennan

(57) ABSTRACT

A temperature monitor system for semiconductor substrates in a front opening unified pod (FOUP) includes a temperature detector and a programmable controller. The temperature detector is in the FOUP and configured to obtain temperature data of semiconductor substrates. The programmable controller is coupled to the temperature detector and configured to control operation of the temperature detector.

20 Claims, 8 Drawing Sheets

SYSTEM AND METHOD OF MONITORING AND CONTROLLING TEMPERATURE OF SEMICONDUCTOR SUBSTRATES IN FOUP

BACKGROUND

Multiple semiconductor substrates are typically stored and transported together in batches by a wafer carrier throughout a semiconductor fabrication facility (also called as "fab") between the loadports of different wafer processing tools or equipment. Such tools generally perform various photolithography, etching, material/film deposition, curing, annealing, inspection, or other processes used in IC chip manufacturing. One such wafer carrier is a front opening unified pod (FOUP) which is a plastic enclosure designed to hold a plurality of wafers ranging from 300 mm to 450 mm sizes in a controlled environment. Typically, each wafer carrier holds approximately 25 wafers. The individual wafers are stacked vertically in the FOUP and stored in a wafer support frame having multiple separate wafer shelves or slots.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
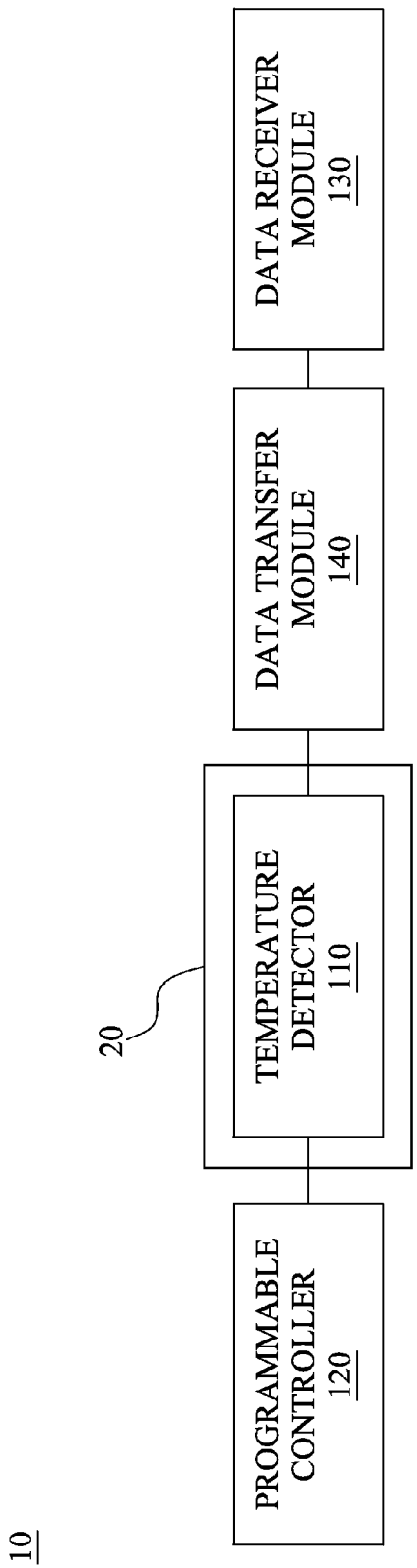
FIG. 1 is a functional block diagram of a temperature monitor system for semiconductor substrates in a front opening unified pod (FOUP) in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As mentioned above, multiple semiconductor substrates (e.g., semiconductor wafers) are typically stored and transported together in batches by a wafer carrier, such as a front opening unified pod (FOUP). However, for advance technologies, heat effect is a key factor for a device on or in the semiconductor substrate not only in process tools but also in the FOUP. Therefore, it is necessary to precisely monitor and control temperature of the semiconductor substrates to prevent defects (e.g., device drift, gate oxide damage, metal electron migration or charging enhancement) from occurring in the device due to heat, such as thermal accumulation provided from a high temperature source or nearby machine.

Figure 2:
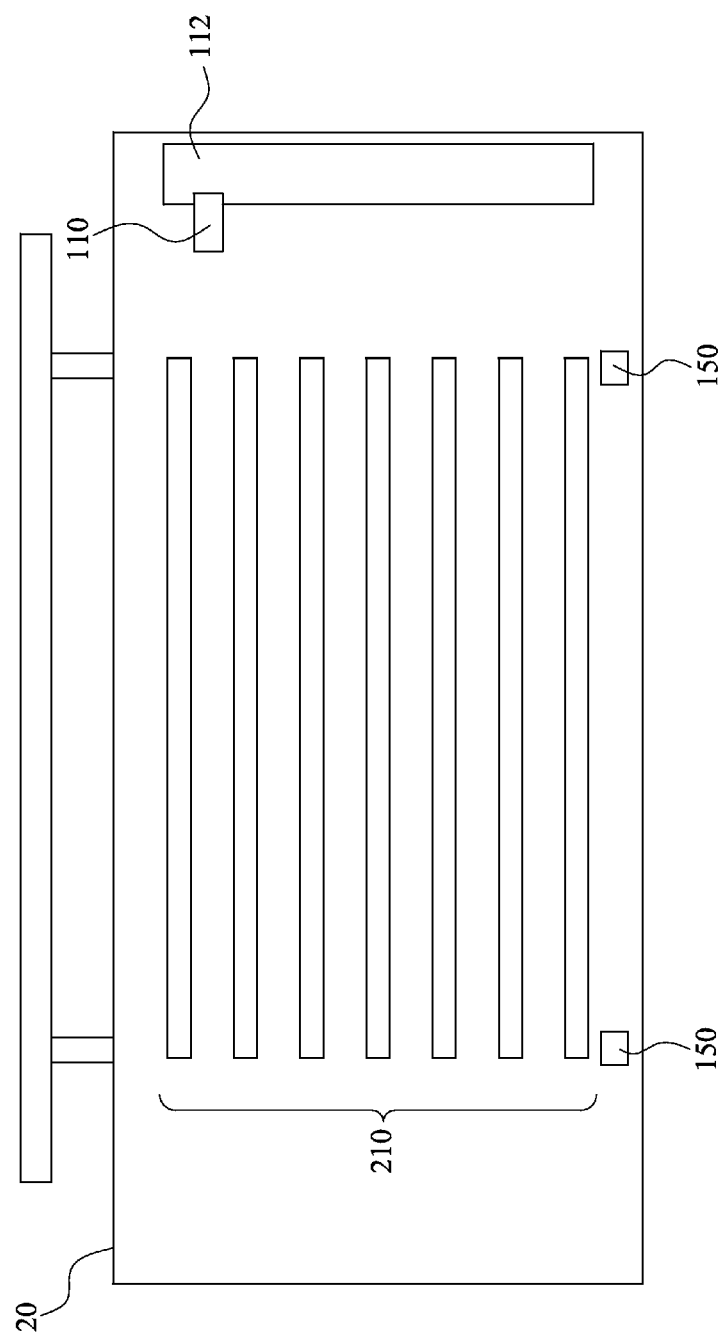
FIG. 2 is a schematic cross-sectional view of a temperature monitor system for semiconductor substrates in a FOUP in accordance with some embodiments of the present disclosure.

Accordingly, the present disclosure provides a temperature monitor system for semiconductor substrates in a FOUP, which includes a temperature detector and a programmable controller. FIG. 1 is a functional block diagram of a temperature monitor system 10 for semiconductor substrates in a FOUP 20 in accordance with some embodiments of the present disclosure. FIG. 2 is a schematic cross-sectional view of a temperature monitor system for semiconductor substrates 210 in a FOUP 20 in accordance with some embodiments of the present disclosure.

Referring to FIGS. 1 and 2, the FOUP 20 is constructed to hold semiconductor substrates 210 securely and safely in a controlled environment. The FOUP 20 allows semiconductor substrates 210 to be removed for processing or measurement by machines equipped with load portsand robotic handling systems. In some embodiments, the FOUP 20 includes a cover (not marked) enclosing a volume to contain the semiconductor substrates 210. In some embodiments, the FOUP 20 includes spaced shelves (not shown) for holding the semiconductor substrates 210. In some embodiments, the FOUP 20 includes a door (not shown) that opens to allow the semiconductor substrates 210 to be placed within or removed from the FOUP 20.

Still referring to FIGS. 1 and 2, the temperature detector 110 is disposed in the FOUP 20 and configured to obtain temperature data of semiconductor substrates 210. In some embodiments, the temperature detector 110 obtains temperature data of each of the semiconductor substrates 210 by sequential detection. In some embodiments, the temperature detector 110 is further configured to obtain temperature data of the FOUP 20. In some embodiments, the temperature detector 110 is a thermocouple, IC temperature sensor, an infrared radiation thermometer or other suitable temperature detectors. In some embodiments, the infrared radiation thermometer includes a housing with a window admitting radiation, an internal optic system and an infrared sensor that is associated with an evaluation unit. The window admitting radiation serves to close off the interior of the housing of the radiation thermometer, thereby protecting the internal optic system and the infrared sensor from contamination and destruction.

In some embodiments, the temperature detector 110 is a thermographic camera (also called as infrared camera or thermal imaging camera), which is a device that forms an image using infrared radiation, similar to a common camera that forms an image using visible light. Instead of the 450 nanometer to 750 nanometer range of the visible light camera, infrared cameras operate in wavelengths as long as 14,000 nm (14 μm).

The thermographic camera may have suitable resolution, field of view (FOV), instantaneous filed of view (IFOV) and noise equivalent temperature difference (NETD). In some embodiments, resolution of the thermographic camera is 160×120, 320×240, 640×480 or 1280×1024 pixels.

The term "FOV" refers to the largest area that the thermographic camera can see at a set distance. In some embodiments, FOV of the thermographic camera is 67°×50°, 32°×24°, 25°×18.8° or 22°×16°.

The term "IFOV" refers to the smallest detail within the FOV that can be detected or seen at a set distance. In some embodiments, IFOV of the thermographic camera is in a range of 0.10 mrad to 2.00 mrad. In some embodiments, IFOV of the thermographic camera is lower than or equal to 1.50 mrad. In some embodiments, IFOV of the thermographic camera is 1.36 mrad.

The term "NETD" refers to the amount of infrared radiation required to produce an output signal equal to the systems own noise. This is a noise rating of the system and should be as low as possible. In some embodiments, NETD of the thermographic camera is lower than or equal to 0.10° C.@+30° C./50 mK. In some embodiments, NETD of the thermographic camera is lower than or equal to 0.05° C.@+30° C./50 mK. In some embodiments, NETD of the thermographic camera is lower than 0.05° C.@+30° C./50 mK.

In some embodiments, the thermographic camera is configured to catch temperature distribution image of a portion of one of the semiconductor substrates 210. In some embodiments, the portion of the one of the semiconductor substrates 210 includes a side surface, a portion of an upper surface, a portion of a lower surface or a combination thereof.

As shown in FIG. 1, the programmable controller 120 is coupled to the temperature detector 110 and configured to control operation of the temperature detector 110. In some embodiments, the operation of the temperature detector 110 controlled by the programmable controller 120 includes position, moving speed, measuring time, focus adjustment, other suitable operation or a combination thereof. In some embodiments, a set of instructions is set up in the programmable controller 120 to control the temperature detector 110. In some embodiments, the programmable controller 120 is built in the temperature detector 110. In some embodiments, the programmable controller 120 is disposed inside of the FOUP 20. In some embodiments, the programmable controller 120 is disposed outside of the FOUP 20.

In some embodiments, the temperature monitor system 10 further includes a data receiver module 130, as shown in FIG. 1. In some embodiments, the data receiver module 130 is configured to receive the temperature data of semiconductor substrates 210 detected by the temperature detector 110, as shown in FIGS. 1 and 2. Therefore, the temperature monitor system 10 can detect and real-time monitor the temperature of each of the semiconductor substrates 210 and the FOUP 20 to perform precisely temperature control, and thus to prevent defects from occurring in the device of the semiconductor substrate 210 due to heat.

In some embodiments, the temperature monitor system 10 further includes a data transfer module 140, as shown in FIG. 1. In some embodiments, the data transfer module 140 is coupled between the temperature detector 110 and the data receiver module 130 to transfer the temperature data from the temperature detector 110 to the data receiver module 130. In some embodiments, the data transfer module 140 is wireless, such as Bluetooth, WiFi or other suitable wireless networks.

In some embodiments, as shown in FIG. 2, the temperature monitor system further includes a track 112 in the FOUP 20, and the temperature detector 110 is configured to be moved on the track 112 by control of the programmable controller 120. In some embodiments, the track 112 is disposed on a sidewall of the FOUP 20, as shown in FIG. 2. In some embodiments, the track 112 has an axis (not marked) vertical or substantially vertical to an upper surface (or a lower surface) of one of the semiconductor substrates 210, and thus the temperature detector 110 can rapidly obtain temperature data of all of the semiconductor substrates 210. In some embodiments, the track 112 is straight line-shaped. In some embodiments, the track 112 is movable around the semiconductor substrates 210 in top view.

In other embodiments, the track (not shown) is ring-shaped and on a sidewall of the FOUP 20 and surrounds the semiconductor substrates 210, and thus the temperature detector (not shown) moved on the track can obtain temperature data of a full peripheral portion of one of the semiconductor substrates 210. In other embodiments, the ring-shaped track is movable along a direction vertical or substantially vertical to an upper surface (or a lower surface) of one of the semiconductor substrates 210.

In some embodiments, as shown in FIG. 2, the temperature monitor system further includes a rotation member 150 in the FOUP 20 and configured to rotate the semiconductor substrates 210. In some embodiments, the FOUP 20 includes spaced shelves (not shown), and the rotation member 150 is coupled to the spaced shelves to rotate the spaced shelves and the semiconductor substrates 210 in the spaced shelves. In some embodiments, the rotation member 150 is in contact with a lowest shelf of the spaced shelves. In some embodiments, the rotation member 150 is not in contact with the semiconductor substrates 210.

Figure 3:
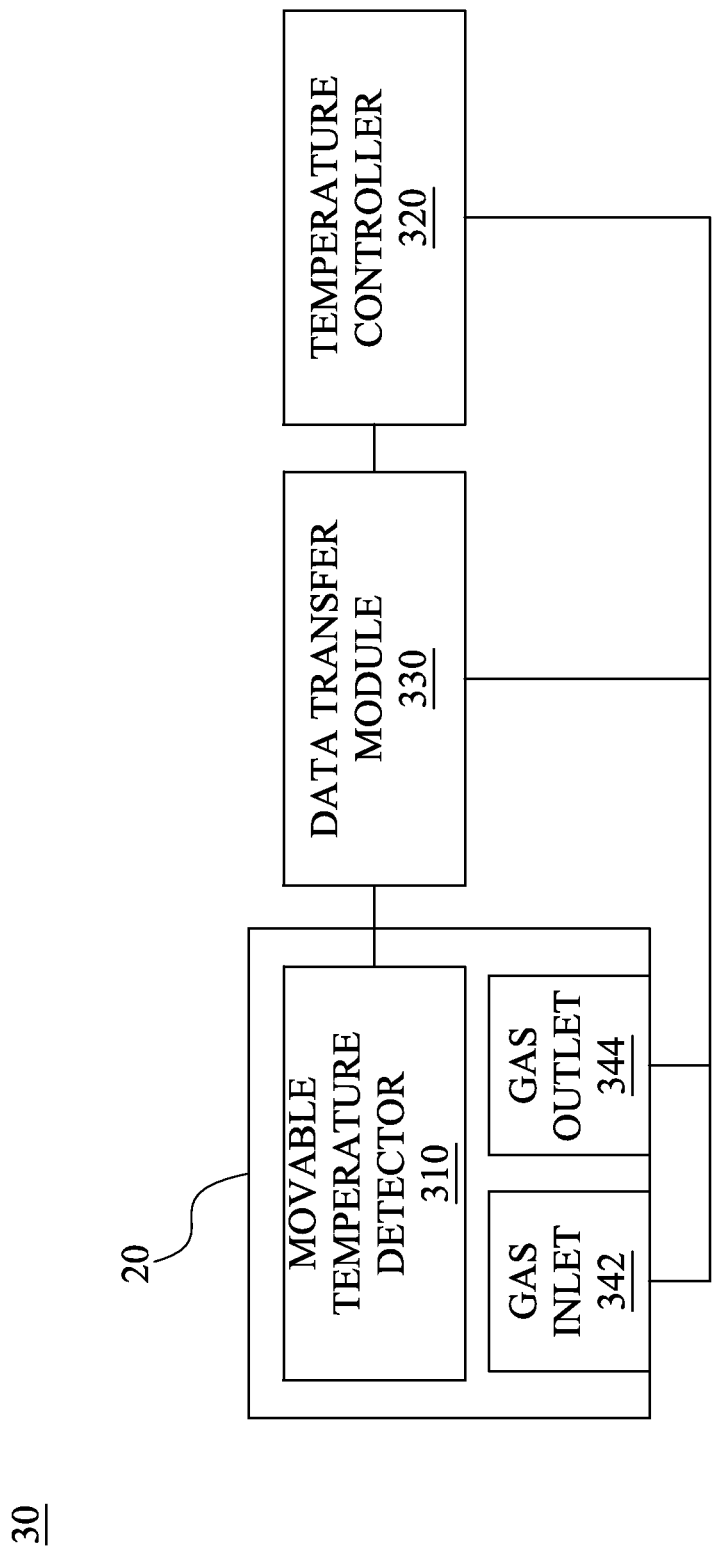
FIG. 3 is a functional block diagram of a temperature monitor and control system for semiconductor substrates in a FOUP in accordance with some embodiments of the present disclosure.
Figure 4:
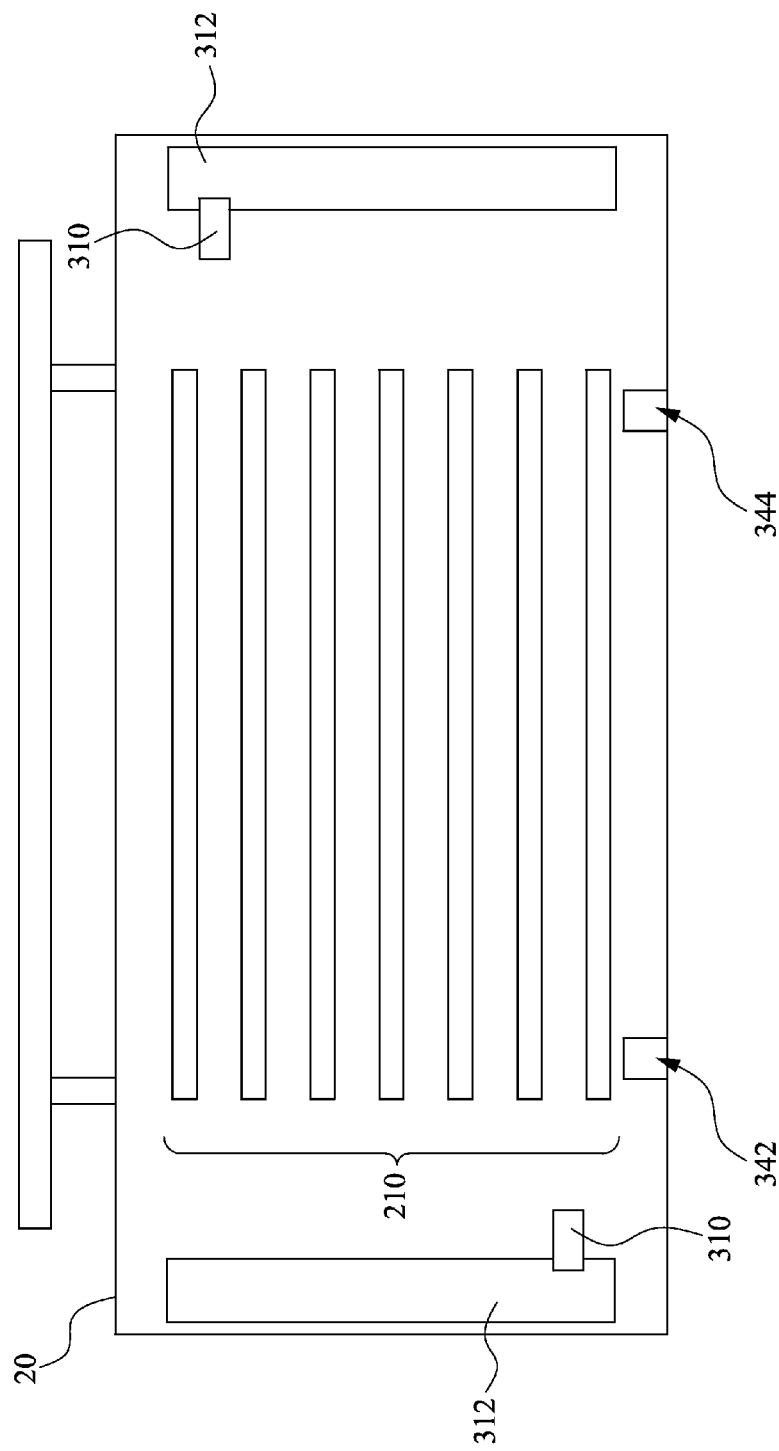
FIG. 4 is a schematic cross-sectional view of a temperature monitor and control system for semiconductor substrates in a FOUP in accordance with some embodiments of the present disclosure.

The present disclosure also provides a temperature monitor and control system for semiconductor substrates in a FOUP, which includes a movable temperature detector and a temperature controller. FIG. 3 is a functional block diagram of a temperature monitor and control system 30 for semiconductor substrates in a FOUP 20 in accordance with some embodiments of the present disclosure. FIG. 4 is a schematic cross-sectional view of a temperature monitor and control system for semiconductor substrates 210 in a FOUP 20 in accordance with some embodiments of the present disclosure. The embodiments of the FOUP 20 are exemplified above, and thus are omitted herein.

Referring to FIGS. 3 and 4, the movable temperature detector 310 is in the FOUP 20 and configured to obtain temperature data of semiconductor substrates 210. In some embodiments, the movable temperature detector 310 obtains temperature data of each of the semiconductor substrates 210 by sequential detection. In some embodiments, the movable temperature detector 310 is further configured to obtain temperature data of the FOUP 20. In some embodiments, the movable temperature detector 310 is a thermocouple, IC temperature sensor, an infrared radiation thermometer or other suitable temperature detectors. In some embodiments, the movable temperature detector 310 is a thermographic camera.

In some embodiments, a programmable controller (not shown) is built in the movable temperature detector 310. The programmable controller can control operation of the movable temperature detector 310, such as position, moving speed, measuring time, focus adjustment, other suitable operation or a combination thereof.

Still referring to FIGS. 3 and 4, the temperature controller 320 is coupled to the movable temperature detector 310 and configured to determine whether to change temperature of one of the semiconductor substrates 210 according to the temperature data. In some embodiments, the temperature controller 320 is configured to compare the temperature data and a predetermined temperature (or predetermined temperature range), and thus to determine whether to change temperature of one of the semiconductor substrates 210.

In some embodiments, the temperature monitor and control system 30 further includes a data transfer module 330, as shown in FIG. 3. In some embodiments, the data transfer module 330 is coupled between the movable temperature detector 310 and the temperature controller 320 to transfer the temperature data from the movable temperature detector 310 to the temperature controller 320. In some embodiments, the data transfer module 330 is wireless, such as Bluetooth, WiFi or other suitable wireless networks.

In some embodiments, as shown in FIG. 3, the temperature monitor and control system further includes a gas inlet 342 and a gas outlet 344 coupled to the temperature controller 320. In some embodiments, as shown in FIG. 4, the gas inlet 342 and the gas outlet 344 are disposed on a surface of the FOUP 20. In some embodiments, a gas source (not shown), such as an inert gas source, is coupled between the gas inlet 342 and the temperature controller 320. In some embodiments, if the temperature data of the semiconductor substrates 210 are higher than the predetermined temperature compared by the temperature controller 320, cool inert gas will be pumped into the FOUP 20 through the gas inlet 342 to decrease the temperature of the semiconductor substrates 210, and the gas in the FOUP 20 is vented through the gas outlet 344. On the contrary, in some embodiments, if the temperature data of the semiconductor substrates 210 are lower than the predetermined temperature compared by the temperature controller 320, hot inert gas will be pumped into the FOUP 20 through the gas inlet 342 to increase the temperature of the semiconductor substrates 210, and the gas in the FOUP 20 is vented through the gas outlet 344.

In some embodiments, as shown in FIG. 4, the temperature monitor and control system 30 further includes a track 312 in the FOUP 20, and the movable temperature detector 310 is configured to be moved on the track 312. In some embodiments, the track 312 is on a sidewall of the FOUP 20. In some embodiments, the track 312 has an axis (not marked) vertical or substantially vertical to an upper surface (or a lower surface) of one of the semiconductor substrates 210, and thus the movable temperature detector 310 can rapidly obtain temperature data of all of the semiconductor substrates 210. In some embodiments, the track 312 is straight line-shaped. In some embodiments, the track 312 is movable around the semiconductor substrates 210 in top view.

Figure 5:
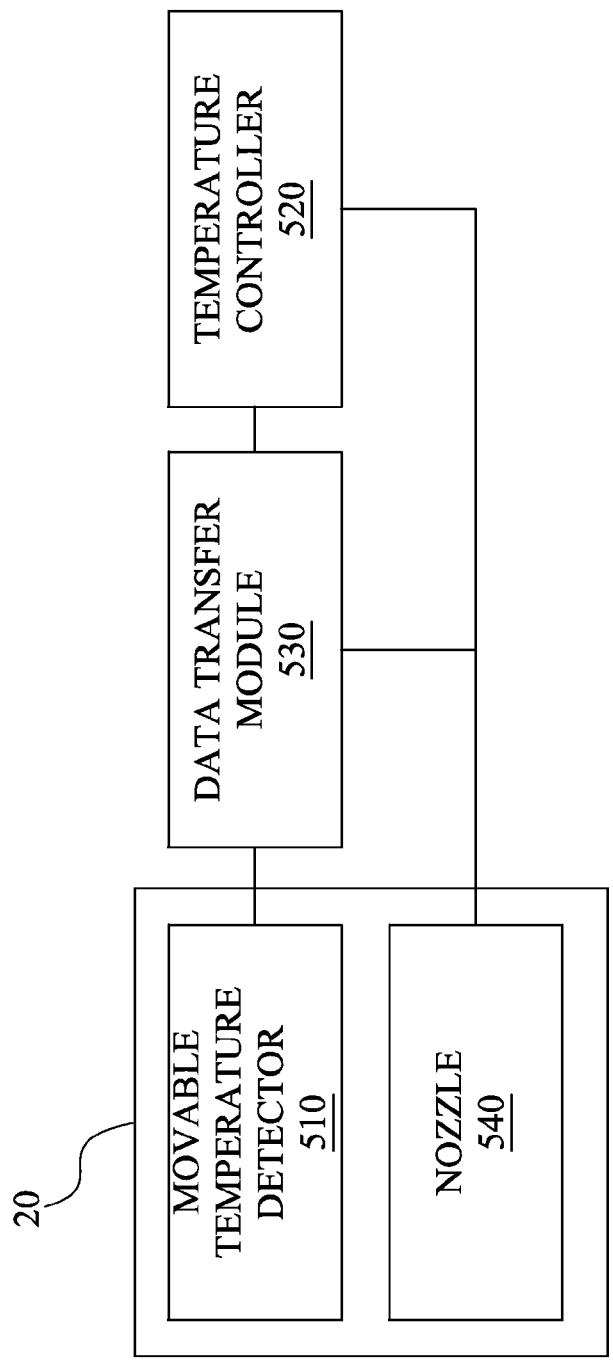
FIG. 5 is a functional block diagram of a temperature monitor and control system for semiconductor substrates in a FOUP in accordance with some embodiments of the present disclosure.
Figure 6:
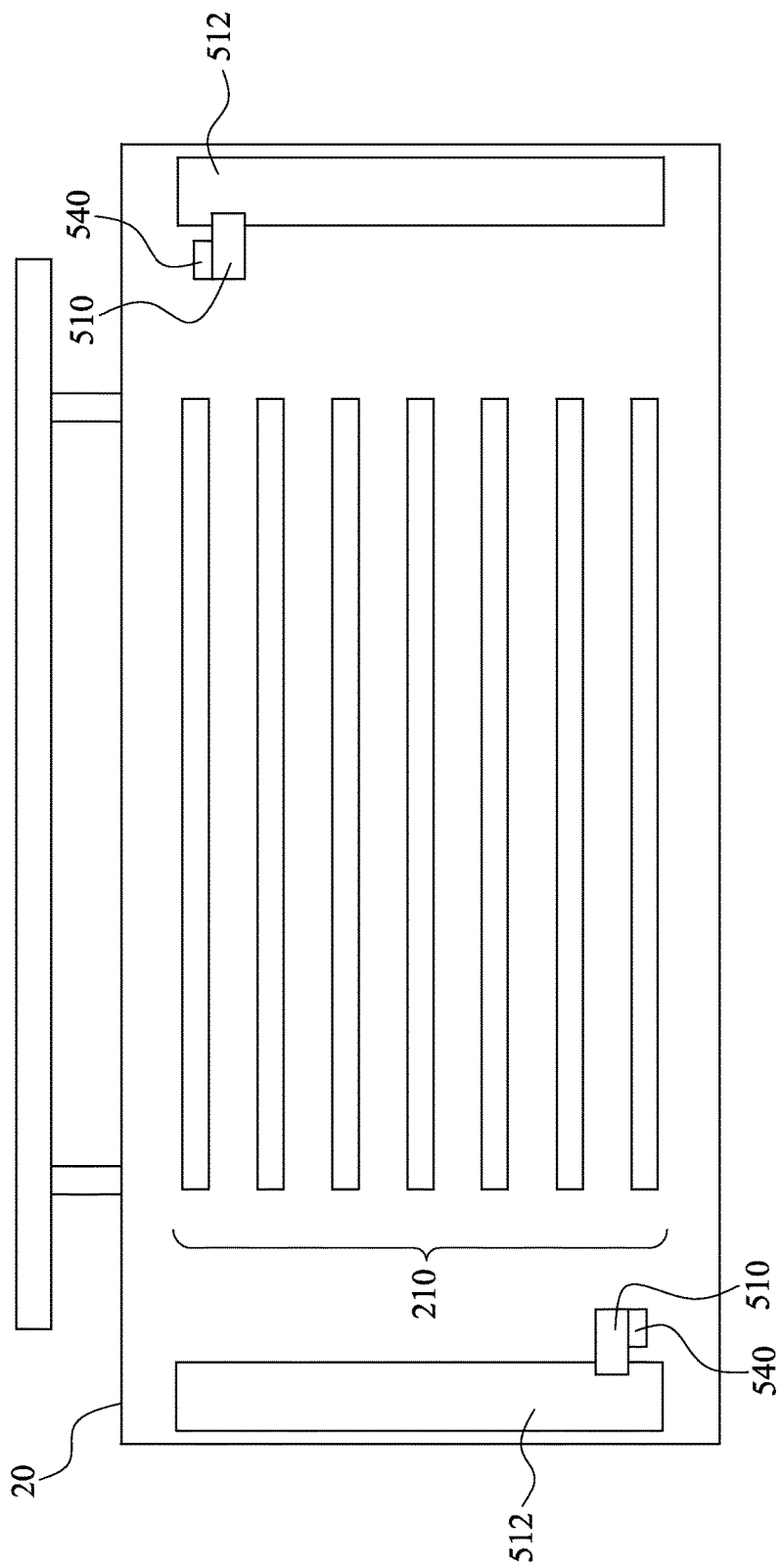
FIG. 6 is a schematic cross-sectional view of a temperature monitor and control system for semiconductor substrates in a FOUP in accordance with some embodiments of the present disclosure.

The present disclosure further provides another temperature monitor and control system for semiconductor substrates in a FOUP, which includes a movable temperature detector and a temperature controller. FIG. 5 is a functional block diagram of a temperature monitor and control system 50 for semiconductor substrates in a FOUP 20 in accordance with some embodiments of the present disclosure. FIG. 6 is a schematic cross-sectional view of a temperature monitor and control system for semiconductor substrates 210 in a FOUP 20 in accordance with some embodiments of the present disclosure.

As shown in FIGS. 5 and 6, the temperature monitor and control system 50 includes a movable temperature detector 510 and a temperature controller 520. The embodiments of the movable temperature detector 510 may be the same as those of the movable temperature detector 310, and thus are omitted herein. In some embodiments, a programmable controller (not shown) is built in the movable temperature detector 510. In some embodiments, the programmable controller controls operation of the movable temperature detector 510, such as position, moving speed, measuring time, focus adjustment, other suitable operation or a combination thereof. The embodiments of the temperature controller 520 may be the same as those of the temperature controller 320, and thus are omitted herein.

In some embodiments, the temperature monitor and control system 50 further includes a data transfer module 530, as shown in FIG. 5. In some embodiments, the data transfer module 530 is coupled between the movable temperature detector 510 and the temperature controller 520 to transfer the temperature data from the movable temperature detector 510 to the temperature controller 520.

It is noteworthy that the difference between the temperature monitor and control system 30 and the temperature monitor and control system 50 is that the temperature monitor and control system 50 includes a nozzle 540 coupled to the temperature controller 520. The nozzle 540 is configured to purge an inert gas onto the one of the semiconductor substrates 210 to change the temperature of the one of the semiconductor substrates 210 by control of the temperature controller 520. In some embodiments, a gas source (not shown), such as an inert gas source, is coupled between the nozzle 540 and the temperature controller 520. In some embodiments, if the temperature data of one of the semiconductor substrates 210 is higher than the predetermined temperature compared by the temperature controller 520, cool inert gas will be purged onto the one of the semiconductor substrates 210 through the nozzle 540 to decrease the temperature of the one of the semiconductor substrates 210. On the contrary, in some embodiments, if the temperature data of one of the semiconductor substrates 210 is lower than the predetermined temperature compared by the temperature controller 520, hot inert gas will be purged onto the one of the semiconductor substrates 210 through the nozzle 540 to increase the temperature of the one of the semiconductor substrates 210.

Specifically, in some embodiments, as shown in FIG. 6, the nozzle 540 is integrated with the movable temperature detector 510. In some embodiments, the nozzle 540 is adjacent to the movable temperature detector 510. In some embodiments, the nozzle 540 is in contact with the movable temperature detector 510. Accordingly, the movable temperature detector 510 obtains temperature data of one of the semiconductor substrates 210, and the temperature data is then transferred to the temperature controller 520 to perform comparison of the temperature data and a predetermined temperature; subsequently, the temperature controller 520 can give an instruction to the nozzle 540 to immediately change the temperature of the one of the semiconductor substrates 210.

In some embodiments, as shown in FIG. 6, the temperature monitor and control system further includes a track 512 disposed in the FOUP 20, and the movable temperature detector 510 is configured to be moved on the track 512. In some embodiments, the track 512 is on a sidewall of the FOUP 20. In some embodiments, the track 512 has an axis (not marked) vertical or substantially vertical to an upper surface (or a lower surface) of one of the semiconductor substrates 210, and thus the movable temperature detector 510 can rapidly obtain temperature data of all of the semiconductor substrates 210. In some embodiments, the track 512 is straight line-shaped. In some embodiments, the track 512 is movable around the semiconductor substrates 210 in top view.

Figure 7:
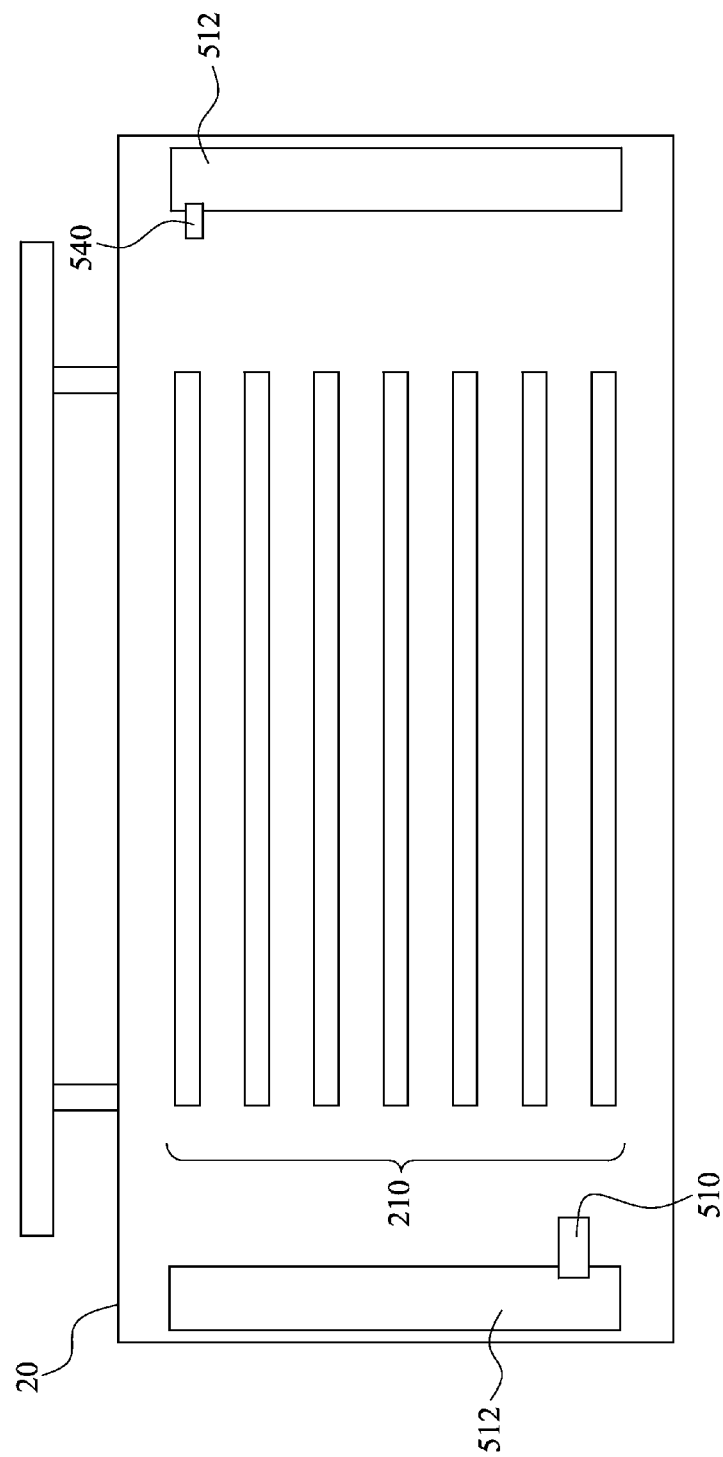
FIG. 7 is a schematic cross-sectional view of a temperature monitor and control system for semiconductor substrates in a FOUP in accordance with some embodiments of the present disclosure.

FIG. 7 is a schematic cross-sectional view of a temperature monitor and control system for semiconductor substrates 210 in a FOUP 20 in accordance with some embodiments of the present disclosure. The difference between the embodiments of FIG. 6 and those of FIG. 7 is that as shown in FIG. 7, a nozzle 540 is configured to be moved on a track 512 in the FOUP 20, and the movable temperature detector 510 and the nozzle 540 are separated, such that temperature monitor and control of the semiconductor substrates in the FOUP 20 can be simultaneously and separately performed to save time.

From the foregoing, the temperature monitor and control system 30 or 50 can detect, real-time monitor and control the temperature of each of the semiconductor substrates 210 and the FOUP 20, and thus to prevent defects from occurring in the device of the semiconductor substrate 210 due to heat.

Figure 8:
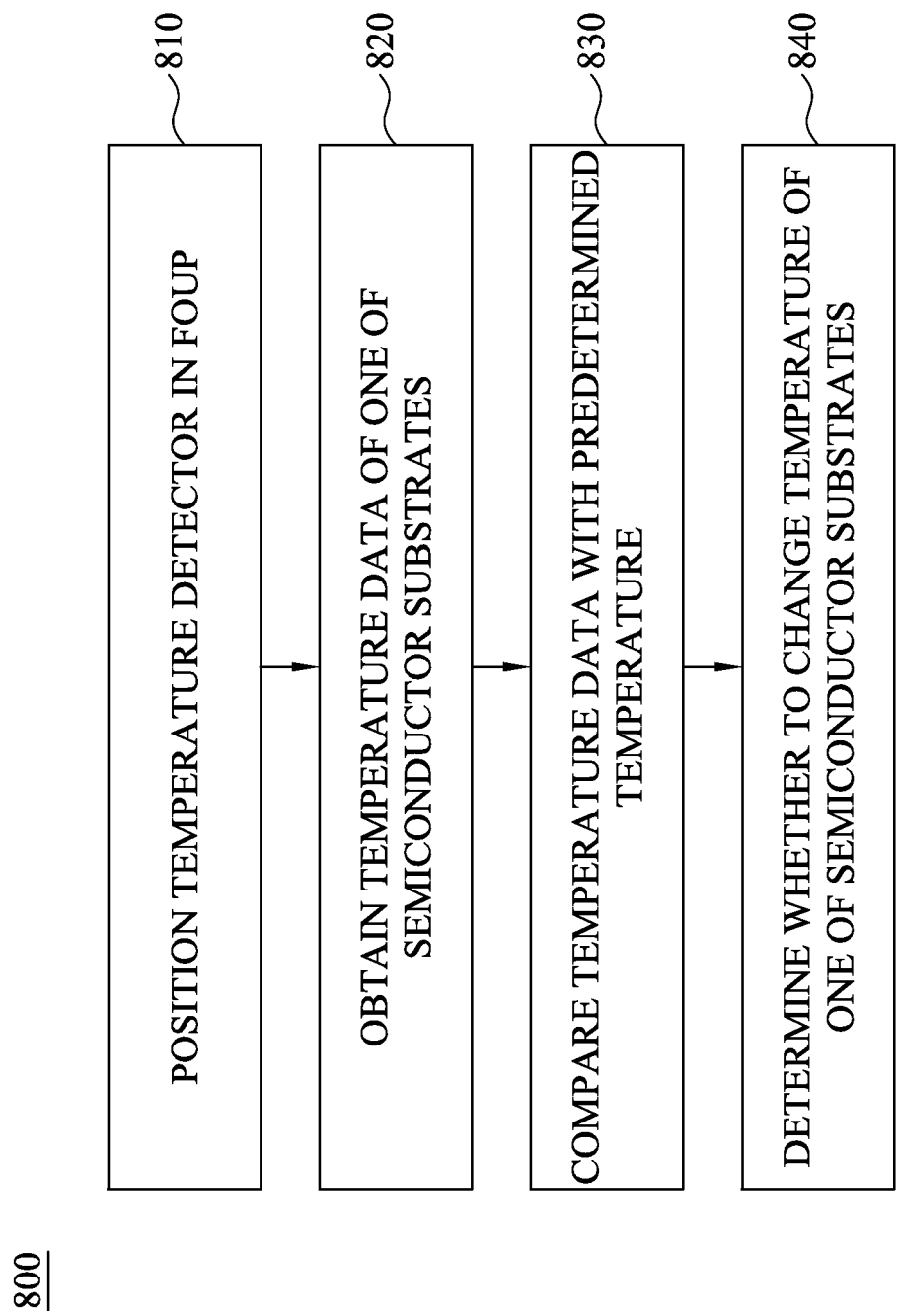
FIG. 8 is a flow chart illustrating a method of monitoring and controlling temperature of semiconductor substrates in a FOUP in accordance with some embodiments of the present disclosure.

FIG. 8 is a flow chart illustrating a method 800 of monitoring and controlling temperature of semiconductor substrates in a FOUP in accordance with some embodiments of the present disclosure.

In operation 810, as shown in FIGS. 3 and 4, a temperature detector 310 is positioned in a FOUP 20 to face (or aligned with) a portion of one of the semiconductor substrates 210. In some embodiments, the temperature detector 310 is a thermocouple, IC temperature sensor, an infrared radiation thermometer or other suitable temperature detectors. In some embodiments, the temperature detector 310 is a thermographic camera.

Any positioning means may be used to position the temperature detector 310. In some embodiments, the temperature detector 310 is positioned using a programmable controller (not shown). In some embodiments, the temperature detector 310 is moved on a track 312. In some embodiments, the temperature detector 310 is stopped at a position of the track 312, which is controlled by the programmable controller. In some embodiments, not only the position but also moving speed, measuring time, focus adjustment, other suitable operation or a combination thereof, of the temperature detector 310 may be set in the programmable controller.

In operation 820, temperature data of the one of the semiconductor substrates 210 is obtained by the temperature detector 310. In some embodiments, the temperature detector 310 is a thermographic camera, and the thermographic camera is configured to catch temperature distribution image of a portion of the one of the semiconductor substrates 210.

In some embodiments, the portion of the one of the semiconductor substrates 210 includes a side surface, a portion of an upper surface, a portion of a lower surface or a combination thereof.

In operation 830, the temperature data is compared with a predetermined temperature (or predetermined temperature range) to provide a comparison result. In some embodiments, a processor, such as a temperature controller 320 shown in FIG. 3, is used to compare the temperature data with the predetermined temperature.

In operation 840, whether to change the temperature of the one of the semiconductor substrates 210 is determined according to the comparison result. In some embodiments, a processor, such as the temperature controller 320 shown in FIG. 3, is used to determine whether to change the temperature of the one of the semiconductor substrates 210. In some embodiments, if the temperature data of one of the semiconductor substrates 210 is higher or lower than the predetermined temperature, the temperature of the one of the semiconductor substrates 210 should be changed.

In some embodiments, the method 800 further includes supplying an inert gas into the FOUP 20, if determining to change the temperature of the one of the semiconductor substrates 210. Any gas source (or gas supplier) and pipeline may be used to supply inert gas into the FOUP 20. In some embodiments, as shown in FIG. 3, a gas inlet 342 and a gas outlet 344 are disposed in the FOUP 20. In some embodiments, a gas source (not shown) is coupled between the gas inlet 342 and the temperature controller 320. In some embodiments, if the temperature data of the semiconductor substrates 210 are higher than the predetermined temperature, cool inert gas will be supplied into the FOUP 20 through the gas inlet 342 to decrease the temperature of the semiconductor substrates 210, and the gas in the FOUP 20 is vented through the gas outlet 344. On the contrary, in some embodiments, if the temperature data of the semiconductor substrates 210 are lower than the predetermined temperature, hot inert gas will be supplied into the FOUP 20 through the gas inlet 342 to increase the temperature of the semiconductor substrates 210, and the gas in the FOUP 20 is vented through the gas outlet 344.

In some embodiments, the method 800 further includes purging an inert gas onto the one of the semiconductor substrates 210, if determining to change the temperature of the one of the semiconductor substrates 210. In some embodiments, as shown in FIG. 5, a nozzle 540 is disposed in the FOUP 20. In some embodiments, a gas source (not shown) is coupled between the nozzle 540 and the temperature controller 520. In some embodiments, if the temperature data of one of the semiconductor substrates 210 is higher than the predetermined temperature, cool inert gas will be purged onto the one of the semiconductor substrates 210 through the nozzle 540 to decrease the temperature of the one of the semiconductor substrates 210. On the contrary, in some embodiments, if the temperature data of one of the semiconductor substrates 210 is lower than the predetermined temperature, hot inert gas will be purged onto the one of the semiconductor substrates 210 through the nozzle 540 to increase the temperature of the one of the semiconductor substrates 210.

In some embodiments, as shown in FIG. 4, the method 800 further includes positioning the temperature detector 310 to face (or aligned with) a portion of next one of the semiconductor substrates 210. In some embodiments, the method 800 further includes obtaining temperature data of the next one of the semiconductor substrates 210 by the temperature detector 310; comparing the temperature data with the predetermined temperature to provide a comparison result; and determining whether to change the temperature of the next one of the semiconductor substrates 210 according to the comparison result.

According to some embodiments, a temperature monitor system for semiconductor substrates in a FOUP includes a temperature detector and a programmable controller. The temperature detector is in the FOUP and configured to obtain temperature data of semiconductor substrates. The programmable controller is coupled to the temperature detector and configured to control operation of the temperature detector.

According to some embodiments, a temperature monitor and control system for semiconductor substrates in a FOUP includes a movable temperature detector and a temperature controller. The movable temperature detector is in the FOUP and configured to obtain temperature data of semiconductor substrates. The temperature controller is coupled to the movable temperature detector and configured to determine whether to change temperature of one of the semiconductor substrates according to the temperature data.

According to some embodiments, a method of monitoring and controlling temperature of semiconductor substrates in a FOUP includes: positioning a temperature detector in the FOUP to face a portion of one of the semiconductor substrates; obtaining temperature data of the one of the semiconductor substrates by the temperature detector; comparing the temperature data with a predetermined temperature to provide a comparison result; and determining whether to change the temperature of the one of the semiconductor substrates according to the comparison result.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A temperature monitor system for semiconductor substrates in a front opening unified pod (FOUP), comprising:
    a temperature detector in the FOUP and configured to obtain temperature data of semiconductor substrates;
    a programmable controller coupled to the temperature detector and configured to control operation of the temperature detector; and
    a track in the FOUP, wherein the temperature detector is configured to be moved on the track by control of the programmable controller.

2. The temperature monitor system of claim 1, wherein the temperature detector is a thermographic camera.

3. The temperature monitor system of claim 1, wherein the track is on a sidewall of the FOUP.

4. The temperature monitor system of claim 1, wherein the track has an axis vertical or substantially vertical to an upper surface of one of the semiconductor substrates.

5. The temperature monitor system of claim 1, wherein the track is movable around the semiconductor substrates.

6. The temperature monitor system of claim 1, further comprising:
    a data receiver module; and
    a data transfer module coupled between the temperature detector and the data receiver module to transfer the temperature data from the temperature detector to the data receiver module.

7. The temperature monitor system of claim 6, wherein the data transfer module is wireless.

8. The temperature monitor system of claim 1, further comprising a rotation member in the FOUP and configured to rotate the semiconductor substrates.

9. A temperature monitor and control system for semiconductor substrates in a front opening unified pod (FOUP), comprising:
    a movable temperature detector in the FOUP and configured to obtain temperature data of semiconductor substrates;
    a temperature controller coupled to the movable temperature detector and configured to determine whether to change temperature of one of the semiconductor substrates according to the temperature data; and
    a nozzle coupled to the temperature controller and configured to purge an inert gas to the one of the semiconductor substrates to change the temperature of the one of the semiconductor substrates by control of the temperature controller, wherein the nozzle is integrated with the movable temperature detector.

10. The temperature monitor and control system of claim 9, wherein the movable temperature detector is a thermographic camera.

11. The temperature monitor and control system of claim 9, further comprising a gas inlet coupled to the temperature controller.

12. The temperature monitor and control system of claim 9, further comprising a track in the FOUP, and the nozzle is configured to be moved on the track.

13. The temperature monitor and control system of claim 9, further comprising:
    a data transfer module coupled between the movable temperature detector and the temperature controller to transfer the temperature data from the movable temperature detector to the temperature controller.

14. A temperature monitor system for semiconductor substrates in a front opening unified pod (FOUP), comprising:
    a track in the FOUP; and
    a movable temperature detector in the FOUP and configured to be moved on the track to obtain temperature data of semiconductor substrates.

15. The temperature monitor system of claim 14, wherein the track is straight line-shaped.

16. The temperature monitor system of claim 15, wherein the track is disposed along a direction vertical or substantially vertical to an upper surface of one of the semiconductor substrates.

17. The temperature monitor system of claim 14, wherein the track is ring-shaped.

18. The temperature monitor system of claim 14, wherein the movable temperature detector is a thermographic camera.

19. The temperature monitor system of claim 14, wherein the track is on a sidewall of the FOUP.

20. The temperature monitor system of claim 14, wherein the track surrounds the semiconductor substrates.

* * * * *